(12) United States Patent
Gotoh et al.

(10) Patent No.: US 8,268,437 B2
(45) Date of Patent: Sep. 18, 2012

(54) METHOD FOR PRODUCING CERAMIC SHEET, CERAMIC SUBSTRATE USING CERAMIC SHEET OBTAINED BY SUCH METHOD, AND USE THEREOF

(75) Inventors: Takeshi Gotoh, Omuta (JP); Motoharu Fukazawa, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 1295 days.

(21) Appl. No.: 11/994,509

(22) PCT Filed: Jun. 30, 2006

(86) PCT No.: PCT/JP2006/313132
§ 371 (c)(1),
(2), (4) Date: Jan. 3, 2008

(87) PCT Pub. No.: WO2007/004579
PCT Pub. Date: Jan. 11, 2007

(65) Prior Publication Data
US 2009/0029128 A1 Jan. 29, 2009

(30) Foreign Application Priority Data
Jul. 4, 2005 (JP) .................................. 2005-194750

(51) Int. Cl.
*H05K 1/00* (2006.01)
(52) U.S. Cl. ........ 428/210; 174/252; 174/258; 257/701; 257/703; 257/706
(58) Field of Classification Search .................. 428/210; 257/701, 703, 706; 174/258, 252
See application file for complete search history.

(56) References Cited

U.S. PATENT DOCUMENTS

| | | | |
|---|---|---|---|
| 6,033,787 A * | 3/2000 | Nagase et al. | 428/545 |
| 6,107,638 A * | 8/2000 | Sumino et al. | 257/43 |
| 6,113,829 A | 9/2000 | Bookbinder et al. | |
| 6,309,737 B1 * | 10/2001 | Hirashima et al. | 428/210 |
| 6,570,099 B1 * | 5/2003 | Hirano et al. | 174/258 |
| 6,911,728 B2 * | 6/2005 | Ishikawa et al. | 257/706 |
| 7,019,975 B2 * | 3/2006 | Nagatomo et al. | 361/704 |
| 7,038,313 B2 * | 5/2006 | Mochizuki et al. | 257/713 |
| 2007/0243409 A1 | 10/2007 | Terao et al. | |

FOREIGN PATENT DOCUMENTS

| | | |
|---|---|---|
| JP | 51 41250 | 10/1976 |
| JP | 2 83265 | 3/1990 |
| JP | 2502628 | 5/1996 |
| JP | 11 21174 | 1/1999 |
| JP | 2000-238023 | 9/2000 |
| JP | 2001 44577 | 2/2001 |
| WO | WO 2005/090032 A1 | 9/2005 |

OTHER PUBLICATIONS

Extended European Search Report issued Apr. 6, 2011, in Application No. / Patent No. 06767720.3-1213 / 1900488 PCT/JP2006313132.

"Methocel Cellulose Ethers", Technical Handbook, XP002629689, Sep. 2002, Retrieved from Internet: URL: http://www.dow.com/dowwolff/en/pdfs/19 2-01062.pdf, pp. 1-29.

* cited by examiner

*Primary Examiner* — Cathy Lam
(74) *Attorney, Agent, or Firm* — Oblon, Spivak, McClelland, Maier & Neustadt, L.L.P.

(57) ABSTRACT

Provided are a process for producing a highly reliable ceramic sheet with stable quality by reducing voids, and a ceramic substrate using the sheet.
A highly reliable ceramic sheet with stable quality is obtained by using hydroxypropylmethyl cellulose as an organic binder, kneading a powder material, preferably, with a twin screw extruder, and then forming a sheet by means of a single screw extruder equipped with a sheet die, and the sheet is suitably used for a ceramic substrate and a ceramic circuit board.

9 Claims, 2 Drawing Sheets

One embodiment of an extruder

One embodiment of a twin screw extruder

One embodiment of single screw extruder

METHOD FOR PRODUCING CERAMIC SHEET, CERAMIC SUBSTRATE USING CERAMIC SHEET OBTAINED BY SUCH METHOD, AND USE THEREOF

TECHNICAL FIELD

The present invention relates to a process for producing a ceramic sheet, a ceramic substrate utilizing it and its use.

BACKGROUND ART

Heretofore, a circuit board has been one having an electrically conductive metal circuit joined to a main surface of a ceramic substrate on which a semiconductor is to be mounted by means of solder, and having a semiconductor device mounted at a predetermined position on the metal circuit. In order to maintain high reliability of a circuit board, it is required that heat generated from a semiconductor device should be dissipated so that the temperature of the semiconductor device will not become excessively high, and thus a ceramic substrate is required to have excellent heat dissipation properties in addition to electrical insulating properties. In recent years, along with miniaturizing of a circuit board and high output of a power module, for a small light-weight module, a ceramic substrate employing a silicon nitride (hereinafter referred to as "SN") sintered body with excellent mechanical properties having high electrical insulating properties and high thermal conductivity and a ceramic circuit board having a metal circuit formed on a main surface of an SN substrate have attracted attention.

A ceramic sintered body to be employed for a ceramic substrate is produced usually by the following process. Namely, a ceramic powder is mixed with additives such as a sintering aid, an organic binder, a plasticizer, a dispersant and a release agent in a suitable amount, and the mixture is molded into a sheet by extrusion or tape molding. Then, the molded product is heated in the air or in an inert gas atmosphere, e.g. nitrogen, at from 450 to 650° C. to remove the organic binder (debindering step), and heated in a non-oxidizing atmosphere such as nitrogen to produce a sintered body. In the case of an SN sintered body, the molded product is pressed in a non-oxidizing atmosphere such as nitrogen and held at from 1,600 to 1,900° C. for from 0.5 to 10 hours (firing step) to produce a sintered body.

In general, by employing extrusion, the thickness in molding will not be limited any more and it is possible to mold a ceramic sheet in the form of either a thin plate or a thick plate. First, a powder mixture comprising a ceramic powder, a sintering aid and an organic powder binder is prepared by using e.g. a universal mixer, an automatic mortar, a mixer or a vibrating sieve. The powder mixture is sprayed with a liquid mixture comprising e.g. water, a release agent and a plasticizer to prepare a granular wet powder material (granulation step) by using e.g. a universal mixer, an automatic mortar, a mixer or a vibrating sieve. Then, this wet powder material is charged into a material feed opening of a kneader to prepare a kneaded clay (kneading step). The kneaded clay thus prepared is charged into a material feed opening of a single screw extruder provided with a die and molded into a sheet. (Patent Documents 1 and 2).

Patent Document 1: JP-A-2-83265
Patent Document 2: JP-A-11-21174

DISCLOSURE OF THE INVENTION

Object to be Accomplished by the Invention

The above conventional production process has problems that the organic binder powder undergoes segregation and that if homogenization during the kneading step is insufficient, voids will appear inside the sintered body to adversely affect the mechanical strength or electric properties of the product, so as to possibly degrade the quality.

The object of the present invention is to provide a process for producing a highly reliable ceramic sheet with stable quality by reducing the voids, and a ceramic substrate utilizing it.

Means to Accomplish the Object

The inventors of the present invention have conducted various studies in order to produce a highly reliable ceramic sheet with stable quality by reducing the voids, and accomplished the present invention with the following gists.

(1) A process for producing a ceramic sheet, which comprises spraying a liquid mixture comprising water, a release agent and a plasticizer to a powder mixture comprising a ceramic powder, a sintering aid and hydroxypropylmethyl cellulose, to prepare a granular wet powder material, kneading the wet powder material, and molding the powder material into a sheet by means of a single screw extruder equipped with a sheet die.

(2) The process for producing a ceramic sheet according to the above (1), wherein the powder mixture contains from 5 to 15 parts by mass of hydroxypropylmethyl cellulose and from 1 to 15 parts by mass of the sintering aid relative to 100 parts by mass of the ceramic powder.

(3) The process for producing a ceramic sheet according to the above (1) or (2), wherein the wet powder material is kneaded by means of a twin screw extruder.

(4) The process for producing a ceramic sheet according to any one of the above (1) to (3), wherein the ceramic powder is a silicon nitride powder.

(5) The process for producing a ceramic sheet according to any one of the above (1) to (4), wherein the hydroxypropylmethyl cellulose contains from 19 to 30 mass % of a methoxy group and from 4 to 12 mass % of a hydroxypropoxyl group.

(6) A ceramic substrate obtained by applying debindering and sintering treatments to a ceramic sheet produced by the process as defined in any one of the above (1) to (5).

(7) The ceramic substrate according to the above (6), wherein a proportion of void is at most 3 vol %.

(8) A ceramic circuit board, which comprises a metal circuit formed on one main surface of the ceramic substrate as defined in the above (6) or (7) and a heatsink joined to the other main surface.

(9) The ceramic circuit board according to the above (8), wherein a partial discharge inception voltage at 10 pC or higher is at least 5 kV.

(10) A module employing the ceramic circuit board as defined in the above (8) or (9).

Effects of the Invention

The present invention provides a process for producing a highly reliable ceramic sheet with stable quality by reducing the voids. The ceramic sheet produced is suitably used for a ceramic substrate, ceramic circuit board and module.

MEANING OF SYMBOLS

Figure 1:
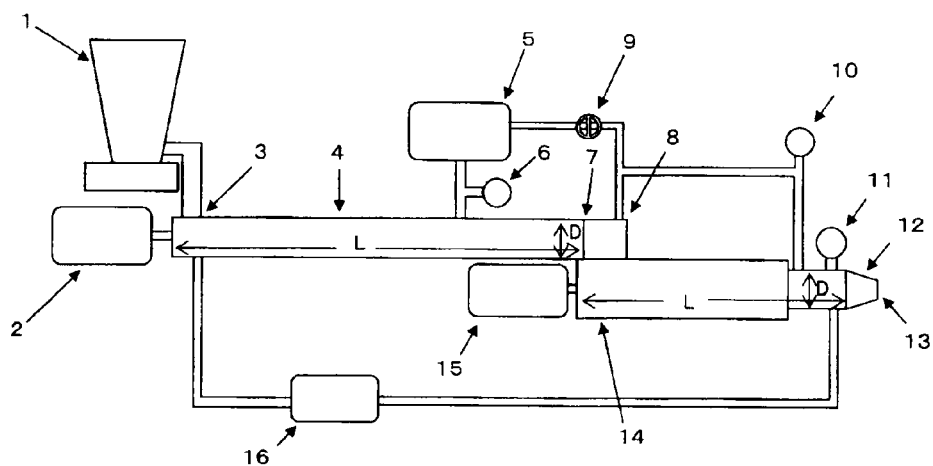
FIG. 1 illustrates a schematic view showing one embodiment of an extruder as a combination of a twin screw extruder with a single screw extruder used in the present invention.

[FIG. 1]
1: Volumetric feeder
2: Variable speed motor of twin screw extruder
3: Wet powder inlet
4: Main body of twin screw extruder
5: Dry vacuum pump
6: Vacuum gauge of twin screw extruder
7: Kneaded clay outlet
8: Vacuum chamber
9: Vacuum cock of single screw extruder side
10: Vacuum gauge for single screw extruder
11: Extrusion pressure gauge
12: Sheet die
13: Sheet extrusion outlet (die)
14: Main body of single screw extruder
15: Variable speed motor of single screw extruder
16: Chiller unit for cooling

Figure 2:
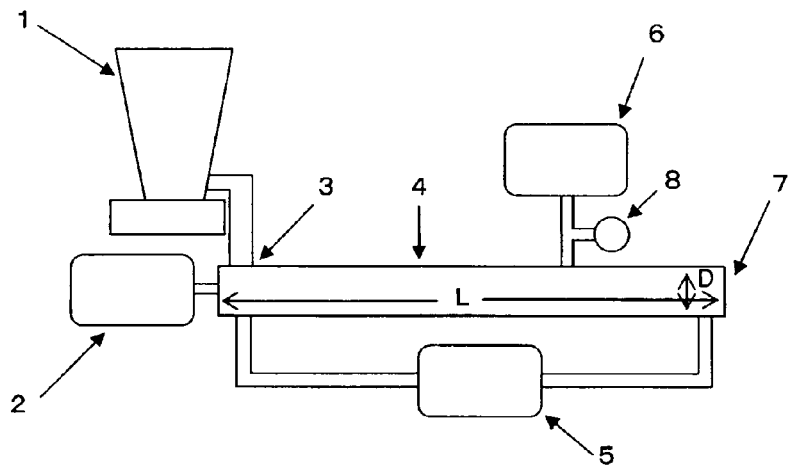
FIG. 2 illustrates a schematic view showing one embodiment of a twin screw extruder used in the present invention.

[FIG. 2]
1: Volumetric feeder
2: Variable speed motor of twin screw extruder
3: Wet powder inlet
4: Main body of twin screw extruder
5: Chiller unit for cooling
6: Dry vacuum pump
7: Kneaded clay outlet
8: Vacuum gauge

Figure 3:
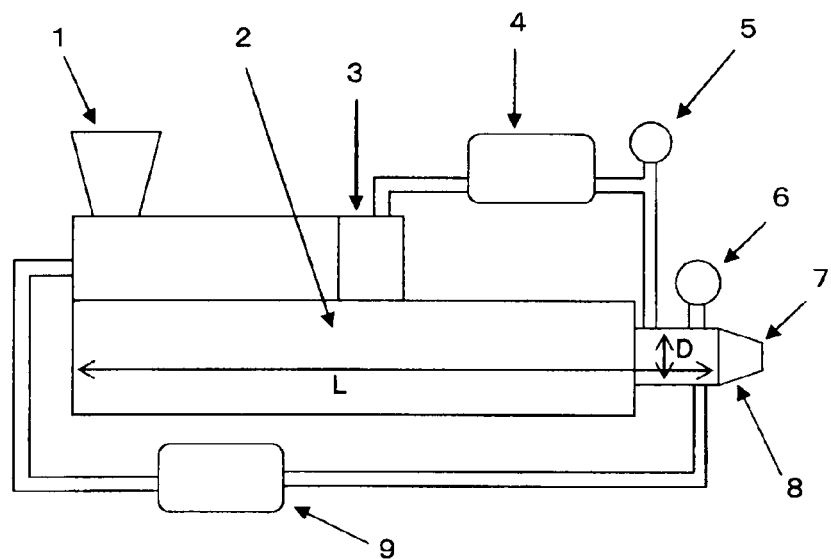
FIG. 3 illustrates a schematic view showing one embodiment of a single screw extruder used in the present invention.

[FIG. 3]
1: Kneaded clay inlet
2: Main body of single screw extruder
3: Vacuum chamber for preliminary kneading
4: Dry vacuum pump
5: Vacuum gauge
6: Extrusion pressure gauge
7: Sheet extrusion outlet (die portion)
8: Sheet die
9: Chiller unit for cooling

BEST MODE FOR CARRYING OUT THE INVENTION

Hydroxypropylmethyl cellulose is used as the organic binder for producing the ceramic sheet of the present invention. The hydroxypropylmethyl cellulose serves for shape retention and lubricity to reduce extrusion pressure in extrusion. It is necessary to simultaneously achieve the shape retention and the lubricity in sheet forming by the extrusion according to the present invention, and in cases where the shape retention is not held after molding and where the extrusion pressure is high due to lack of lubricity, no stable molded product can be obtained. Furthermore, the sheet after forming is required to have sufficient strength and flexibility because the sheet is punched into a desired size after forming. If the strength is insufficient, the molded product will be brittle, whereby the sheet cannot be punched; if the flexibility is insufficient, cracking will occur in punching, whereby the quality of the product might be degraded.

The lubricity can be evaluated by measuring an extrusion pressure in sheet forming wherein a sheet is extruded from an aperture with a rectangular shape of 0.5 mm×80 mm by a single screw extruder equipped with a sheet die. On the other hand, the shape retention can be evaluated by measuring a thickness of a sheet formed. Furthermore, the strength of the sheet can be evaluated in accordance with JIS K 6251 and the flexibility of the sheet can be evaluated by measuring an angle at which the sheet cracks, as evaluation after the sheet forming.

The hydroxypropylmethyl cellulose to be used in the present invention contains preferably from 19 to 30 mass %, particularly preferably from 25 to 28 mass % of a methoxy group, and contains preferably from 4 to 12 mass %, particularly preferably from 7 to 10 mass % of a hydroxypropoxyl group. If the content of the methoxy group or the hydroxypropoxyl group is outside the above range, no stable molded product might be obtained or the flexibility of the molded product might be insufficient.

An amount of the hydroxypropylmethyl cellulose used is preferably from 5 to 15 parts by mass, particularly preferably from 7 to 12 parts by mass, relative to 100 parts by mass of the ceramic powder. If the amount is less than 5 parts by mass, the molded product will fail to have sufficient strength, whereby cracking might occur. On the other hand, if the amount exceeds 15 parts by mass, dimensional failure or deformation might occur because the density of the molded product decreases in removal of the binder during the debindering step, thereby increasing a shrinkage rate during the sintering step.

Examples of the sintering aid to be used in the present invention include oxides, fluorides, chlorides, nitrates and sulfates of rare earth metals consisting of Sc, Y and lanthanoid elements or alkaline earth metals such and Ca and Sr. In order to obtain a ceramic sintered body, it is possible to obtain the sintered body by heating particles to near the melting point of the ceramic to fuse the particles; however, in a case where the ceramic powder is a nitride ceramic, the ceramic powder has no melting point and will decompose in some cases; therefore, a sintering aid is preferably added to the ceramic powder. When the ceramic is SN, a rare earth oxide such as yttrium oxide is preferably used as the sintering aid. A rare earth oxide and a silicon oxide which is a surface oxide film of the SN powder form a liquid phase during sintering to promote growth of SN particles and to promote sintering of SN.

An amount of the sintering aid to be used is preferably from 1 to 15 parts by mass, particularly preferably from 4 to 10 parts by mass, relative to 100 parts by mass of the ceramic powder. If the amount to be used is less than 1 part by mass or exceeds 15 parts by mass, no highly dense sintered body might be obtained. According to the present invention, it is further preferable to use an alkaline earth metal oxide and/or silicon oxide in addition to the aforementioned sintering aid to decrease the firing temperature. An amount of the alkaline earth metal oxide and/or silicon oxide to be used is preferably from 0.1 to 5 parts by mass relative to 100 parts by mass of the ceramic powder.

The ceramic powder to be used in the present invention may be one of various ceramic powders, for example, oxide powders such as $SiO_2$ and $Al_2O_3$, carbide powders such as SiC and nitride powders such as AlN and SN, among which the nitride powders such as the SN powder and AlN powder are preferably used. The ceramic powder preferably has an average particle size of from 0.3 to 1.5 µm, particularly preferably from 0.5 to 1.0 µm. For example, the SN powder preferably has a particle size distribution of an average particle size (D50 value): from 0.6 to 0.8 µm, D90 value: from 1.5 to 3.0 µm and D100 value: at most 8.0 µm measured by microtrack SPA (Leeds & Northrup Company). Furthermore, the SN powder preferably has a specific surface area of from 10 to 15 $m^2/g$. If the powder has a value outside the above range, no stable molded product might be obtained or the strength of the molded product might be insufficient.

The SN powder to be used in the present invention may be a powder produced by a known method such as a direct nitriding method or imide pyrolysis method, and it is preferred to use one having an oxygen amount of at most 1.5 mass %. The SN powder is preferably subjected to a surface treatment with stearic acid, oleic acid, phosphoric acid or the like so as to prevent hydrolysis. If the surface treatment is not carried out, an oxygen amount in the SN powder will increase due to hydrolysis and the quality of the substrate might degrade.

In the present invention, it is preferred to suitably blend a plasticizer such as refined glycerol, glycerin triolate or diethylene glycol, a release agent such as a stearic acid type or silicon type, and, if necessary, a dispersant in the powder mixture containing the ceramic powder, sintering aid and hydroxypropylmethyl cellulose. An amount of each agent to be added is preferably from 0.1 to 5 parts by mass (outer percentage) relative to 100 parts by mass of the ceramic powder.

A granular wet powder material of the present invention is prepared by spraying a liquid mixture containing water, a release agent and a plasticizer to a powder mixture comprising a ceramic powder, a sintering aid and hydroxypropylmethyl cellulose. For example, the powder mixture comprising the ceramic powder, the sintering aid and hydroxypropylmethyl cellulose is mixed by means of a ball mill, the resulting powder mixture is taken out, and thereafter the liquid mixture comprising water, the release agent and the plasticizer is sprayed to the resulting powder mixture with compressed air under stirring in a mixer, thereby obtaining the granular wet powder material.

The release agent contained in the above-mentioned liquid mixture may be, for example, a stearic acid type compound of a fatty acid ester type, an emulsion type or a calcium type, or a silicon type compound containing a fatty acid. Furthermore, the plasticizer used may be refined glycerol, glycerin triolate, diethylene glycol, or the like. The water to be preferably used is deionized water or purified water. Contents of the release agent and the plasticizer in the liquid mixture are both preferably from 2 to 12 mass %, particularly preferably from 3 to 6 mass %, relative to 100 parts by mass of the ceramic powder.

After preparing the above-mentioned wet powder material, a kneaded clay is prepared in a kneading step and the kneaded clay after the kneading step is preferably homogeneous in order to conduct the sheet extrusion with a single screw extruder in a stable state and in a continuous manner. In order to obtain a homogeneous kneaded clay, it is preferred to sufficiently dissolve and uniformly disperse hydroxypropylmethyl cellulose in the kneaded clay. For it, it is preferred to exert sufficient shear stress on the kneaded clay and to continuously conduct the kneading treatment from the production capacity viewpoint.

The kneading treatment can be carried out, e.g., using a three roll mill, a single screw extruder or a twin screw extruder. The three roll mill can exert enough shear stress on the kneaded clay, but the viscosity of the kneaded clay changes every treatment batch because of evaporation of moisture by heat generation during kneading, whereby it might be difficult to obtain a stable kneaded clay. Furthermore, in the case of the single screw extruder, the shear stress appears in casing and screw portions and plural times of kneading operations are required in order to obtain a homogeneous kneaded clay, whereby the production capacity might be low.

On the other hand, the twin screw extruder can exert the shear stress on the kneaded clay in a plurality of gear portions of twin screws, thereby obtaining a homogeneous kneaded clay in a short period of time. Further, the twin screw extruder is preferably connected to a chiller unit for cooling so that heat generated in kneading can be removed before discharging the kneaded clay and the kneaded clay discharged can be controlled at a temperature of from 5 to 15° C., thereby obtaining the stable and homogeneous kneaded clay.

The number of revolutions of the screws is suitably determined depending upon the screw structure in the twin screw extruder, and is preferably from 50 to 200 rpm, particularly preferably from 80 to 150 rpm. If the number of revolutions is less than 50 rpm, no desired discharge amount will be obtained, thus decreasing the productivity in some cases; on the other hand, if the number of revolutions exceeds 200 rpm, heat generation of the kneaded clay tends to be significant, and the fluidity of the kneaded clay will decrease due to gelation of the binder by heat, whereby no stable kneaded clay might be obtained.

In the twin screw extruder to be used in the present invention, a portion from the kneading portion to the strand die is vacuumized in order to remove bubbles contained in the kneaded clay by kneading. On this occasion, a vacuum atmosphere is preferably maintained with a degree of vacuum of preferably at most 1333 Pa, particularly preferably at most 666 Pa, as represented by absolute pressure.

The kneaded clay can be evaluated with the thixotropic index (hereinafter referred to as "Ti value") represented by the ratio of the viscosity at the shear stress of 0.3 MPa and the viscosity at the shear stress of 0.9 MPa by means of a falling flow tester with a sample holder maintained at 10° C. The Ti value in a case where the kneaded clay is homogeneous and good moldability can be achieved is preferably from 1.5 to 3.5, particularly preferably from 2.0 to 3.0, and an outline of a sheet cross section becomes flat in this range. If the Ti value is less than 1.5, the shape retention during sheet forming will be poor and dimensions in the sheet width and thickness directions will be unstable, so that the dimensional failure or deformation of the ceramic substrate after firing might occur. On the other hand, if the Ti value exceeds 3.5, the extrusion pressure during extrusion will become high, and the burden will become high on the single screw extruder, so that stable sheet forming might not be continued.

In the present invention, it is preferred to use deionized water or purified water as the water contained in the liquid mixture and, as a result, contained in the kneaded clay. An amount of water to be used is preferably from 10 to 20 parts by mass, particularly preferably from 12 to 18 parts by mass, relative to 100 parts by mass of the ceramic powder. If the amount is less than 10 parts by mass, the fluidity of the kneaded clay will be so poor that the sheet forming might be affected adversely. On the other hand, if the amount exceeds 20 parts by mass, the viscosity of the kneaded clay will decrease and it will become difficult to retain the sheet shape, so that thickness unevenness can occur in the sheet width direction.

The single screw extruder to be used in the sheet forming in the present invention can continuously and stably produce sheets with different thicknesses by pressurizing the kneaded clay with the single screw and by attaching a sheet die with its aperture adjustable, to a discharge outlet. Furthermore, the single screw extruder has such a characteristic that bubbles contained in the kneaded clay can be removed by vacuumizing with a dry vacuum pump attached thereto.

The kneaded clay obtained by the twin screw extruder is charged in the single screw extruder equipped with the sheet die to conduct sheet forming; in order to conduct the forming continuously and stably, the twin screw extruder is connected to the chiller unit for cooling to adjust the temperature of the molded product at from 5 to 15° C. The kneaded clay formed into the sheet shape is preferably heated and dried at from 80 to 100° C., for example, with a belt drier to control the moisture content preferably to from 0.5 to 3 mass %, thereby obtaining a ceramic sheet.

The strength of the ceramic sheet is preferably at least 1.5 MPa, particularly preferably at least 2.0 MPa. If the sheet strength is less than 1.5 MPa, in a case where the sheet is punched into a desired shape with a mold, the sheet might be torn, or the sheet might crack, thus decreasing the yield or adversely affecting the insulating property of the product.

For the ceramic substrate according to the present invention, the ceramic sheet is subjected to a heat treatment in a stream of nitrogen gas, air, or the like preferably at from 350 to 700° C., preferably, for from 1 to 10 hours to remove the binder (debinder). For obtaining a nitride ceramic substrate, the sheet is then put in a container made of boron nitride, graphite, silicon nitride or the like and sintered in an atmosphere of a non-oxidizing gas such as nitrogen, argon, ammonia or hydrogen and, particularly, in the case of SN, sintered preferably under an increased pressure of from 0.5 to 0.9 MPa, preferably, at from 1700 to 1900° C.

A ceramic circuit board of the present invention is produced by joining a metal plate for a metal circuit to one main surface of the ceramic substrate, joining a metal plate for a heatsink to the other main surface, printing an etching resist on a circuit surface, and subjecting it to an etching treatment.

The ceramic substrate and the metal plate or the metal circuit can be joined by a method of heating them with interposition of a solder containing Al—Cu, Ag, Cu or an Ag—Cu alloy and an active metal component, for example, such as Ti, Zr or Hf in an inert gas or vacuum atmosphere, or by a method of heating them with interposition of an Al alloy foil such as Al—Mg in vacuum. Then, an etching resist is printed in a circuit pattern on the circuit surface with use of a photoresist, screen printing, or the like, and an etching treatment is carried out using copper chloride, iron chloride, aqueous ammonia, sulfuric acid-hydrogen peroxide, or the like as an etchant, thereby producing the ceramic circuit board.

On the occasion of printing the etching resist as described above, positioning is carried out by butting, and if there is a defect in the longitudinal or transverse dimension or the shape of the ceramic substrate due to dimensional failure or deformation, the printing deviation of the circuit pattern will occur, and wire bonding set positions will be inappropriate in a subsequent module assembling step, which could result in deterioration of electric characteristics.

The ceramic substrate produced according to the present invention has excellent mechanical properties and high thermal conductivity, and is therefore suitable for a circuit board to be used under severe use conditions.

There are no particular restrictions on the thickness of the ceramic substrate of the present invention, but the thickness is preferably in a range of from about 0.3 to 1.0 mm, for example, when significance is attached to the heat dissipation property, and the thickness is usually in a range of from about 1 to 3 mm when it is desired to remarkably increase the isolation voltage under a high voltage.

With respect to the ceramic substrate produced by the present invention, it is possible to obtain a uniform ceramic substrate free from agglomeration of the binder or the like because the kneaded clay is sufficiently kneaded by the twin screw extruder. The proportion of voids in the ceramic substrate is preferably at most 3 vol %. When the proportion of voids is preferably at most 3 vol %, particularly preferably at most 2 vol %, the deflective strength of the ceramic substrate becomes high and further the insulation property under high voltage tends to be high. Regarding partial discharge characteristics representing the discharge characteristics of the substrate, the ceramic circuit board of the present invention can have the partial discharge inception voltage at 10 pC or higher of preferably at least 5 kV, particularly preferably at least 7.5 kV.

The materials for the metal circuit and the metal heatsink are preferably Al, Cu or an Al—Cu alloy. They can be used in the form of a single layer or a laminate with a cladding containing it as an alloy layer. Particularly, Al is more likely to undergo plastic deformation due to a lower yield stress than Cu and thus can significantly reduce the thermal stress on the ceramic substrate when subjected to thermal stress load, e.g., in heat cycles. Accordingly, Al is less likely to have horizontal cracks occurring between the metal circuit and the ceramic substrate than Cu, and it is thus feasible to prepare a more highly reliable module.

There are no particular restrictions on the thickness of the metal circuit, but it is preferably from 0.2 to 0.5 mm in the case of an Al circuit and from 0.1 to 0.5 mm in the case of a Cu circuit in view of electrical and thermal specifications in general. On the other hand, the heatsink is required to have a thickness enough to prevent warpage in soldering, and, for example, an Al heatsink preferably has the thickness of from 0.2 to 0.5 mm, and a Cu heatsink preferably has the thickness of from 0.1 to 0.5 mm in general.

EXAMPLES

Example 1

<Experiment Nos. 1 to 13>

An SN powder mentioned below was subjected to a surface treatment by adding 3 parts by mass of oleic acid to 100 parts by mass of the SN powder and by mixing them with a mixer, and 5.5 parts by mass of $Y_2O_3$, 3 parts by mass of MgO, and hydroxypropylmethyl cellulose were mixed in 100 parts by mass of the resulting SN powder with a Bolton mixer. Then, the mixture thus obtained was charged into a mixer and a solution mixture composed of a plasticizer, a release agent and deionized water mentioned below was sprayed to the resulting mixture by compressed air (0.2 MPa) under stirring in such a composition that the plasticizer was 3 parts by mass (outer percentage), the release agent was 3 parts by mass (outer percentage) and the deionized water was 18 parts by mass, relative to 100 parts by mass of the SN powder, to prepare a granular wet powder material.

<Materials Used>

SN powder: α-rate 90%, D50 value 0.7 μm, D90 value 2.0 μm, D100 value 4.6 μm, specific surface area 12 $m^2/g$.

$Y_2O_3$: Manufactured by Shin-Etsu Chemical Co., Ltd., tradename "Yttrium Oxide," D50 particle size of powder 1.0 μm.

MgO: Manufactured by Iwatani Chemical Industry Co., Ltd., tradename "MTK-30," D50 particle size of powder 0.2 μm, specific surface area 160 $m^2/g$.

Hydroxypropylmethyl cellulose: Manufactured by Shin-Etsu Chemical Co., Ltd., tradename "METOLOSE-60SH, 65SH, 90SH."

Plasticizer: Manufactured by Kao Corporation, tradename "EXCEPARL," main component glycerol.

Release agent: Manufactured by SAN NOPCO LIMITED, tradename "Nopcocera LU-6418," main component: stearic acid.

In a kneading step, the wet powder material obtained in the above procedure was fed at 6 kg/h into a twin screw extruder (D=29 mm, L=1160 mm (L/D=40)). During the kneading, the number of revolutions of the screws was 100 rpm, the degree of vacuum was 666 Pa as absolute pressure, and the twin screw extruder was maintained at 10° C. with a chiller unit for cooling. A part of the resulting kneaded clay was sampled and subjected to measurement of Ti value.

The kneaded clay obtained in the kneading step was molded into a sheet with a single screw extruder. The single screw extruder used in the molding step had D=42 mm and L=1200 mm, and was maintained at 10° C. with a chiller unit for cooling. A sheet was continuously molded in a width of 80 mm×a thickness of 0.5 mm with a sheet die under an operational condition of the number of screw revolutions of 60 rpm (discharge amount: 6 kg/h) in the single screw extruder, and dimensions, sheet strength and angle of cracking were measured.

The sheet molded was dried by a belt drier maintained at 100° C. until the moisture content became 2 mass %, and the dried sheet was punched into dimensions of 60 mm×50 mm by a pressing machine provided with a mold. The punched sheet was put in a crucible made of boron nitride and held in the atmosphere under normal pressure and at 500° C. for 4 hours to effect debindering. Then, the sheet was sintered at 1800° C. in a nitrogen pressurized atmosphere of 0.8 MPa for 4 hours with a carbon heater electric furnace to prepare an SN sintered body, and the deflective strength and the proportion of voids were measured.

In order to evaluate the performance of the obtained SN sintered body as a circuit board, copper plates were used as a metal circuit and a metal heatsink and joined and formed in a circuit pattern by the following method.

30 parts by mass of terpineol was added to 100 parts by mass of a powder mixture composed of 85 mass % of Ag, 10 mass % of Cu, 2 mass % of Zr and 3 mass % of TiH to prepare a paste liquid mixture. This liquid mixture was applied onto both sides of the SN sintered body obtained in the above procedure, in a coating amount of 5 mg/cm$^2$ with a screen printer. Then, oxygen-free copper plates in 2.5 inch×2 inch× 0.01 inch thickness were bonded to each side up to fourteen layers and the laminate was fixed on a carbon jig with carbon screws and held at 850° C. for 2 hours to prepare a joined body in which the SN sintered body was sandwiched by the copper plates.

Screen printing was carried out with a UV curable resist ink so as to form a circuit pattern in a desired shape on one main surface of the joined body and a heatsink pattern on the other main surface, followed by irradiation with a UV lamp to cure the resist film. Then, portions other than the portion coated with the resist were etched with a cupric chloride solution and the resist was removed by an ammonium fluoride aqueous solution to prepare an SN substrate with a copper circuit, followed by measurement of the partial discharge inception voltage. Table 1 shows the results.

<Materials Used>
  Copper plate: Oxygen-free copper plate (JIS H 3100, manufactured by Sumitomo Metal Mining Blass & Copper Co., Ltd.).
  UV curable resist ink: "PER-27B-6" manufactured by GOO CHEMICAL CO., LTD.
<Measuring Methods>
  Ti value: The ratio of the viscosity at shear stress of 0.3 MPa to the viscosity at shear stress of 0.9 MPa was obtained by a falling flow tester "CFT-100D manufactured by SHIMADZU CORPORATION," with a sample holder maintained at 10° C.

Extrusion pressure: The extrusion pressure was measured while a sheet was molded from an aperture of a rectangular shape of 0.5 mm×80 mm by adjusting a die attached to a sheet die.

Sheet dimension: The thickness in the sheet width direction was measured by means of a micrometer (average value of n=5).

Sheet strength: The strength of a sheet in the width of 10 mm and the length of 40 mm was measured in accordance with JIS K6251 "tensile test method."

Crack occurrence angle: A sheet was folded up to the maximum angle of 120° and an angle of occurrence of a crack was measured.

Deflective strength of sintered body: The strength was measured by a three-point bending test (JIS R1601) under conditions of a lower span of 30 mm and a crosshead speed of 0.5 mm/min (average value of n=5).

Proportion of voids: The ceramic sintered body was polished to half of the thickness, diameters of voids were measured for voids having the diameter of at least 15 μm with an electron microscope, and the proportion of voids was obtained by the following formula (average value of n=3).

Proportion of voids (vol%)=$\{\Sigma(4/3\pi r^3)/(W \times L \times t)\} \times 100$ where r: radius of void (mm), W: width of the sintered body (mm), L: length of the sintered body (mm), t: thickness of the sintered body (mm).

Partial discharge inception voltage: The prepared circuit board was immersed in an insulating oil ("Fluorinert FC-77" manufactured by Sumitomo 3M Limited) and while the voltage was applied at a rate of 1 kV/min, the voltage at the partial discharge amount of 10 pC was taken as the partial discharge inception voltage (average value of n=5).

Example 2

<Experiment Nos. 14 and 15>
The same operation as in Example 1 was carried out except that only a three-roll mill or a single screw extruder was used instead of the twin screw extruder. Table 1 shows the results.

TABLE 1

| | Hydroxypropylmethyl cellulose | | | | |
| Experiment No. | Amount added * (parts by mass) | Content of methoxy group (mass %) | Hydroxypropoxyl group | Knead Kneading method | Ti value |
| --- | --- | --- | --- | --- | --- |
| 1 | 10 | 25 | 8 | Twin screw extruder | 2.0 |
| 2 | 10 | 19 | 8 | Twin screw extruder | 1.6 |
| 3 | 10 | 30 | 8 | Twin screw extruder | 3.4 |
| 4 | 10 | 25 | 4 | Twin screw extruder | 3.5 |
| 5 | 10 | 25 | 12 | Twin screw extruder | 1.5 |
| 6 | 5 | 25 | 8 | Twin screw extruder | 3.5 |
| 7 | 15 | 25 | 8 | Twin screw extruder | 1.5 |
| 8 | 10 | 35 | 8 | Twin screw extruder | 5.0 |
| 9 | 10 | 15 | 8 | Twin screw extruder | 1.0 |

TABLE 1-continued

| | | | | | | |
|---|---|---|---|---|---|---|
| 10 | 10 | 25 | 2 | Twin screw extruder | 5.0 | |
| 11 | 10 | 25 | 15 | Twin screw extruder | 1.1 | |
| 12 | 3 | 25 | 8 | Twin screw extruder | 6.0 | |
| 13 | 20 | 25 | 8 | Twin screw extruder | 1.2 | |
| 14 | 10 | 25 | 8 | Three roll mill | 3.4 | |
| 15 | 10 | 25 | 8 | Single screw extruder | 3.4 | |

| | | Sheet | | | |
|---|---|---|---|---|---|
| Experiment No. | Extrusion pressure (MPa) | Sheet thickness (mm) | Sheet width (mm) | Sheet strength (MPa) | Crack occurrence angle (°) |
| 1 | 3.5 | 0.5 | 80 | 4.6 | >120 |
| 2 | 3.0 | 0.5 | 80 | 2.1 | >120 |
| 3 | 4.5 | 0.5 | 80 | 6.6 | >120 |
| 4 | 4.5 | 0.5 | 80 | 5.0 | >120 |
| 5 | 3.0 | 0.3 | 80 | 4.3 | >120 |
| 6 | 4.5 | 0.5 | 80 | 2.0 | >120 |
| 7 | 3.0 | 0.5 | 80 | 7.2 | >120 |
| 8 | 6.0 | 0.5 | 80 | 7.2 | 100 |
| 9 | 2.5 | 0.5 | 82 | 1.3 | 100 |
| 10 | 6.0 | 0.5 | 80 | 5.2 | 80 |
| 11 | 2.5 | 0.3 | 82 | 4.1 | >120 |
| 12 | 7.5 | 0.5 | 80 | 1.3 | 100 |
| 13 | 3.0 | 0.3 | 82 | 8.0 | >120 |
| 14 | 3.0-4.0 | 0.5 | 80 | 4.6 | >120 |
| 15 | 3.0-3.5 | 0.5 | 80 | 4.7 | >120 |

| | Sintered body | | Circuit board | |
|---|---|---|---|---|
| Experiment No. | Deflective strength (MPa) | Proportion of void (vol %) | Partial discharge inception voltage (kV) | Note |
| 1 | 750 | 1 | 8.0 | Example |
| 2 | 700 | 2 | 8.0 | |
| 3 | 650 | 3 | 7.5 | |
| 4 | 700 | 2 | 8.0 | |
| 5 | 700 | 2 | 8.0 | |
| 6 | 650 | 3 | 8.0 | |
| 7 | 600 | 3 | 7.5 | |
| 8 | 500 | 5 | 4.0 | |
| 9 | Crack occurrence in punching | | | |
| 10 | 450 | 7 | 3.0 | |
| 11 | 500 | 5 | 4.0 | |
| 12 | Crack occurrence in punching | | | |
| 13 | 550 | 5 | 4.0 | |
| 14 | 450 | 7 | 3.0 | Comparative |
| 15 | 500 | 5 | 4.0 | Example |

* An amount added relative to 100 parts by mass of the SN powder

In the case of the circuit boards of the SN sintered bodies according to Examples of the present invention, the deflective strength of the SN sintered body is high, the proportion of voids is at most 3 vol %, and the partial discharge inception voltage at 10 pC or higher of the circuit board is at least 5 kV, whereby it is understood that each circuit board has high reliability.

INDUSTRIAL APPLICABILITY

The highly reliable ceramic sheet with less voids and stable quality produced by the present invention is suitably used as a ceramic substrate, a ceramic circuit board and a module in a wide range of fields.

The entire disclosure of Japanese Patent Application No. 2005-194750 filed on Jul. 4, 2005 including the specification, claims, drawings and summary is incorporated herein by reference in its entirety.

The invention claimed is:

1. A ceramic substrate obtained by applying debindering and sintering treatments to a ceramic sheet produced by a process which comprises
   spraying a liquid mixture comprising water, a release agent and a plasticizer to a powder mixture comprising a ceramic powder, a sintering aid and hydroxypropylmethyl cellulose, to prepare a granular wet powder material,
   kneading the wet powder material, and
   molding the powder material into a sheet by means of a single screw extruder equipped with a sheet die,
   wherein the wet powder material is kneaded by means of a twin screw extruder,
   wherein the powder mixture comprises from 5 to 15 parts by mass of hydroxypropylmethyl cellulose and from 1 to 15 parts by mass of the sintering aid relative to 100 parts by mass of the ceramic powder, and
   wherein the hydroxypropylmethyl cellulose comprises from 19 to 30 mass % of a methoxy group and from 4 to 12 mass % of a hydroxypropoxyl group.

2. The ceramic substrate according to claim 1, wherein a proportion of voids in the ceramic substrate is at most 3 vol %.

3. The ceramic substrate according to claim 2, wherein the proportion of voids in the ceramic substrate is at most 2 vol %.

4. The ceramic substrate according to claim 1, wherein the powder mixture comprises from 7 to 12 parts by mass of hydroxypropylmethyl cellulose and from 4 to 10 parts by mass of the sintering aid relative to 100 parts by mass of the ceramic powder.

5. The ceramic substrate according to claim 1, wherein the hydroxypropylmethyl cellulose comprises from 25 to 28 mass % of a methoxy group and from 7 to 10 mass % of a hydroxypropoxyl group.

6. A ceramic circuit board, wherein the ceramic substrate consists of two main surfaces, and which comprises a metal circuit formed on one main surface of the ceramic substrate as defined in claim 1 and a heatsink joined to the other main surface.

7. The ceramic circuit board according to claim 6, wherein a partial discharge inception voltage at 10 pC or higher of the ceramic circuit board is at least 5 kV.

8. The ceramic circuit board according to claim 7, wherein the partial discharge inception voltage at 10 pC or higher of the ceramic circuit board is at least 7.5 kV.

9. A module employing the ceramic circuit board as defined in claim 6.

* * * * *